United States Patent
Farnworth

(10) Patent No.: US 6,680,458 B2
(45) Date of Patent: *Jan. 20, 2004

(54) LASER MARKING TECHNIQUES FOR BARE SEMICONDUCTOR DIE

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,999

(22) Filed: Aug. 30, 2001

(65) Prior Publication Data

US 2002/0030040 A1 Mar. 14, 2002

Related U.S. Application Data

(63) Continuation of application No. 09/258,652, filed on Feb. 26, 1999.

(51) Int. Cl.$^7$ .................. B23K 26/00; B23K 26/14; B23K 26/16; G01D 15/14; B41J 2/435

(52) U.S. Cl. .................. 219/121.68; 219/121.6; 219/121.65; 219/121.69; 347/224; 347/262; 430/270.1

(58) Field of Search ............... 219/121.68, 121.69, 219/121.6, 121.65; 347/185, 224, 262, 110

(56) References Cited

U.S. PATENT DOCUMENTS

| | | | |
|---|---|---|---|
| 3,712,740 A | 1/1973 | Hennings | |
| 4,269,917 A | 5/1981 | Drexler et al. | |
| 4,375,025 A | 2/1983 | Carlson | |
| 4,534,804 A | 8/1985 | Cade | |
| 4,585,931 A | 4/1986 | Duncan et al. | |
| 4,638,144 A * | 1/1987 | Latta, Jr. ............... | 219/121 LH |
| 4,707,722 A | 11/1987 | Folk et al. | |
| 4,753,863 A * | 6/1988 | Spanjer ................... | 430/138 |
| 4,861,620 A | 8/1989 | Azuma et al. | |
| 4,945,204 A | 7/1990 | Nakamura et al. | |
| 5,030,551 A | 7/1991 | Herren et al. | |
| 5,206,496 A | 4/1993 | Clement et al. | |
| 5,329,090 A | 7/1994 | Woelki et al. | |
| 5,357,077 A | 10/1994 | Tsuruta | |
| 5,420,575 A * | 5/1995 | Cheraso et al. ........ | 340/825.44 |
| 5,454,881 A | 10/1995 | Fischer | |
| 5,463,200 A * | 10/1995 | James et al. ........... | 219/121.68 |
| 5,761,301 A | 6/1998 | Oshima et al. | |
| 5,801,356 A * | 9/1998 | Richman ............... | 219/121.68 |
| 5,837,962 A | 11/1998 | Overbeck | |
| 5,838,361 A * | 11/1998 | Corbett .................. | 347/262 |
| 5,841,099 A | 11/1998 | Owen et al. | |
| 5,937,270 A | 8/1999 | Canella | |
| 5,958,528 A * | 9/1999 | Bernecker ............... | 428/29 |
| 5,959,768 A * | 9/1999 | Hutton .................. | 353/62 |
| 5,986,235 A | 11/1999 | Canella | |
| 6,034,378 A | 3/2000 | Shiraishi | |
| 6,108,026 A | 8/2000 | Corbett | |
| 6,114,191 A * | 9/2000 | Young et al. ........... | 438/125 |
| 6,127,069 A * | 10/2000 | Balz et al. ............. | 430/318 |
| 6,160,835 A * | 12/2000 | Kwon .................. | 372/108 |
| 6,162,651 A | 12/2000 | Khosropour | |
| 6,214,917 B1 * | 4/2001 | Linzmeier et al. ......... | 106/415 |
| 6,238,847 B1 * | 5/2001 | Axtell et al. ............. | 427/555 |
| 6,248,973 B1 | 6/2001 | Matsumura et al. | |
| 6,291,551 B1 * | 9/2001 | Kniess et al. ........... | 430/270.1 |
| 6,392,683 B1 * | 5/2002 | Hayashi .................. | 347/224 |

* cited by examiner

Primary Examiner—L. Edmondson
(74) Attorney, Agent, or Firm—TraskBritt

(57) ABSTRACT

A laser marking apparatus and method having an energy source which is not substantially transmissible through the substrate of a semiconductor chip, or the substrate of the semiconductor chip is substantially opaque to the energy source for marking the surface of a semiconductor chip, are described herein.

61 Claims, 8 Drawing Sheets

LASER MARKING TECHNIQUES FOR BARE SEMICONDUCTOR DIE

CROSS-REFERENCE TO RELATED APPLICATION

This application is a continuation of application Ser. No. 09/258,652, filed Feb. 26, 1999, pending.

BACKGROUND OF THE INVENTION

1. Field of the Invention

This invention relates generally to laser marking techniques and, more specifically, to an apparatus and method for marking the surface of a bare semiconductor device, comprising one or more dice, using a laser without damage to the circuitry or components of the semiconductor device.

2. State of the Art

Since the first semiconductor devices became commercially available, manufacturers have found it necessary to mark each semiconductor chip or assembly of semiconductor chips (bare die or package) with the company name, a part or serial number, or other information such as lot number or semiconductor die location. Conventional marking methods utilize a mechanical device to transfer ink contained in an ink pad to the surface of a stamp. An individual semiconductor chip is then stamped, and the automated process is repeated for subsequent semiconductor chips.

Because of its mechanical nature and the drying time associated with ink, an ink stamping process is relatively slow. Moreover, if the mark is accidentally touched prior to complete drying, the mark will smudge. In semiconductor chip manufacturing processes using such an ink stamping method, the ink marking operation may have to be included at a relatively early stage of production (if the semiconductor die itself is to be marked) or just after post-encapsulation processing (if the package is to be marked) to allow for drying time without affecting the production rate. Such early marking may result, however, in marking defective semiconductor chips that never make it completely through the manufacturing process.

Another problem associated with ink stamping methods is that the quality of ink stamped marks may substantially vary over time. This variation may be dependent upon the quantity of ink applied, ambient temperature and humidity, and/or the condition of the surface of the stamp. In any event, the consistency of a stamped mark may vary widely from semiconductor chip to semiconductor chip.

As a result of the deficiencies associated with ink stamping, it has become increasingly popular to use a laser beam to mark the surface of a semiconductor chip. Unlike ink stamping, laser marking is very fast, requires no curing time, has a consistently high quality, and can take place at the end of the manufacturing process so that only known good semiconductor chips (dice) are marked.

Various machines and methods have been developed for marking a semiconductor chip with a laser. As illustrated in U.S. Pat. No. 5,357,077 to Tsuruta, U.S. Pat. No. 5,329,090 to Woelki et al., U.S. Pat. No. 4,945,204 to Nakamura et al., U.S. Pat. No. 4,638,144 to Latta, Jr., U.S. Pat. No. 4,585,931 to Duncan et al., and U.S. Pat. No. 4,375,025 to Carlson, a semiconductor device is placed in a position, where a laser beam, usually produced by a carbon dioxide, Nd:YAG, or Nd:YLF laser, inscribes various characters or other information on a surface of the semiconductor device. Basically, the laser beam erodes or causes a transformation or change in the reflectivity of a portion of the surface of the semiconductor chip such that a different reflectivity from the rest of the semiconductor chip surface is formed. By holding the semiconductor chip at a proper angle to a light source, the information inscribed on the semiconductor chip by the laser can be read.

Various materials are known in the art that are laser reactive (e.g., capable of changing color when contacted by a laser beam). As described in U.S. Pat. No. 4,861,620 to Azuma et al., U.S. Pat. No. 4,753,863 to Spanjer, and U.S. Pat. No. 4,707,722 to Folk et al., the part or component may be partially comprised of the laser markable material or have a coating of the material on the surface of the part or component to be marked.

Using a laser to mark a semiconductor chip is a fast and economical means of marking. There are, however, certain disadvantages associated with state-of-the-art laser marking techniques that merely erode or change the reflectivity of a portion of the surface to achieve the desired mark in comparison to ink stamping. For example, ink stamping provides a clearly visible image on the surface of a semiconductor chip at nearly every angle of incidence to a light source. A mark made in a surface by a laser, on the other hand, may only be visible at select angles of incidence to a light source. Further, oils or other contaminants deposited on the semiconductor chip surface subsequent to marking may blur or even obscure the mark. Additionally, because the laser erodes or changes the reflectivity of a portion of the surface of the work piece, for bare semiconductor die marking, the energy of the laser beam and its effect on the semiconductor chip may damage the internal circuitry or components of the semiconductor chip directly or by increasing internal semiconductor chip temperature beyond acceptable limits. Additionally, for bare semiconductor chip marking the substrate upon which the bare semiconductor chip is formed may allow the transmission of the light from the laser therethrough, causing damage to the circuitry of the semiconductor chip or changes in the materials used in the components of the semiconductor chip. Thus, it would be advantageous to provide a marking technique that combines the speed and precision of laser marking without any substantial curing or drying time. Moreover, it would be advantageous to develop a method and apparatus for marking the surface of a semiconductor chip that does not harm the circuitry, components, or materials therein.

SUMMARY

According to the present invention, a laser marking apparatus and method are disclosed wherein an object is subjected to a laser beam for marking purposes.

In one aspect of the invention, the laser is selected to have a light frequency source which is not transmissible through the substrate, i.e., the substrate is opaque to the light frequency source of the laser, or to substantially heat the substrate in bulk to thereby affect the delicate internal circuitry of the semiconductor chip or expose such circuitry to such energy source and/or potentially damaging heat.

In another aspect of the invention, subsequent to or while being marked, the semiconductor chip is subjected to a jet of coolant to rapidly cool the markings and/or prevent or reduce the potential for heat damage to the semiconductor chip. The coolant may be in a liquid, gas, or solid state. In this manner, any residual heat contained in the substrate material or present in the semiconductor chip may be rapidly dissipated. The semiconductor chip is cooled before exiting the marking apparatus.

In another more particular aspect of the invention, the laser marking apparatus is computer controlled. In addition to controlling the laser beam, chip location, and other process parameters, the central processing unit (CPU) may control the quality of markings. If so, the marked chips may be subjected to a camera which feeds an image of each chip to the CPU. The CPU compares the pixels of the captured image to a given resolution standard. If the marking is of a sufficiently high quality, the chips are automatically accepted. If not, the chips are automatically rejected for rework and remarking.

DETAILED DESCRIPTION OF THE ILLUSTRATED EMBODIMENT

Figure 1:
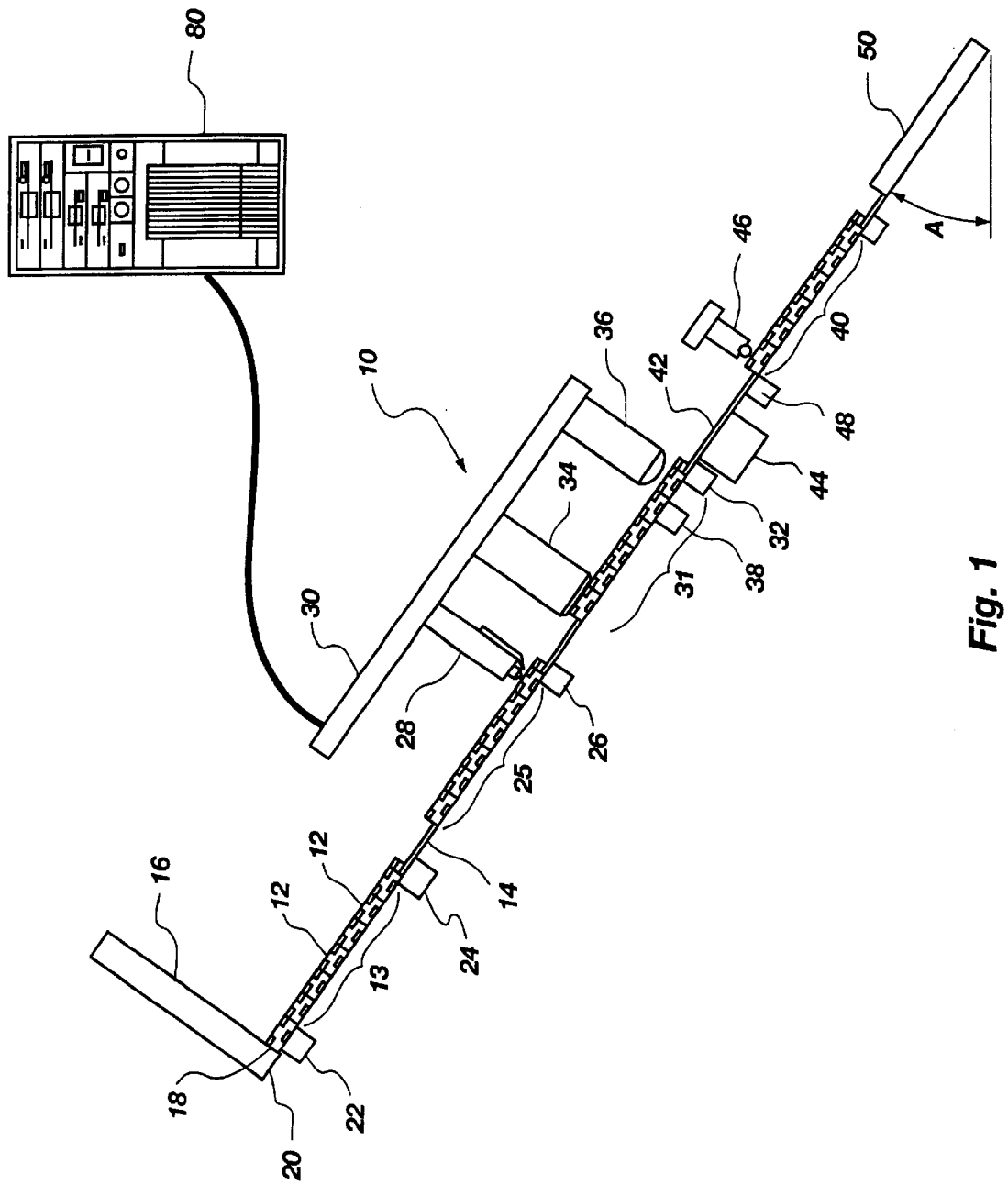
FIG. 1 is a schematic side view of a laser marking apparatus in accordance with the present invention.
Figure 3:
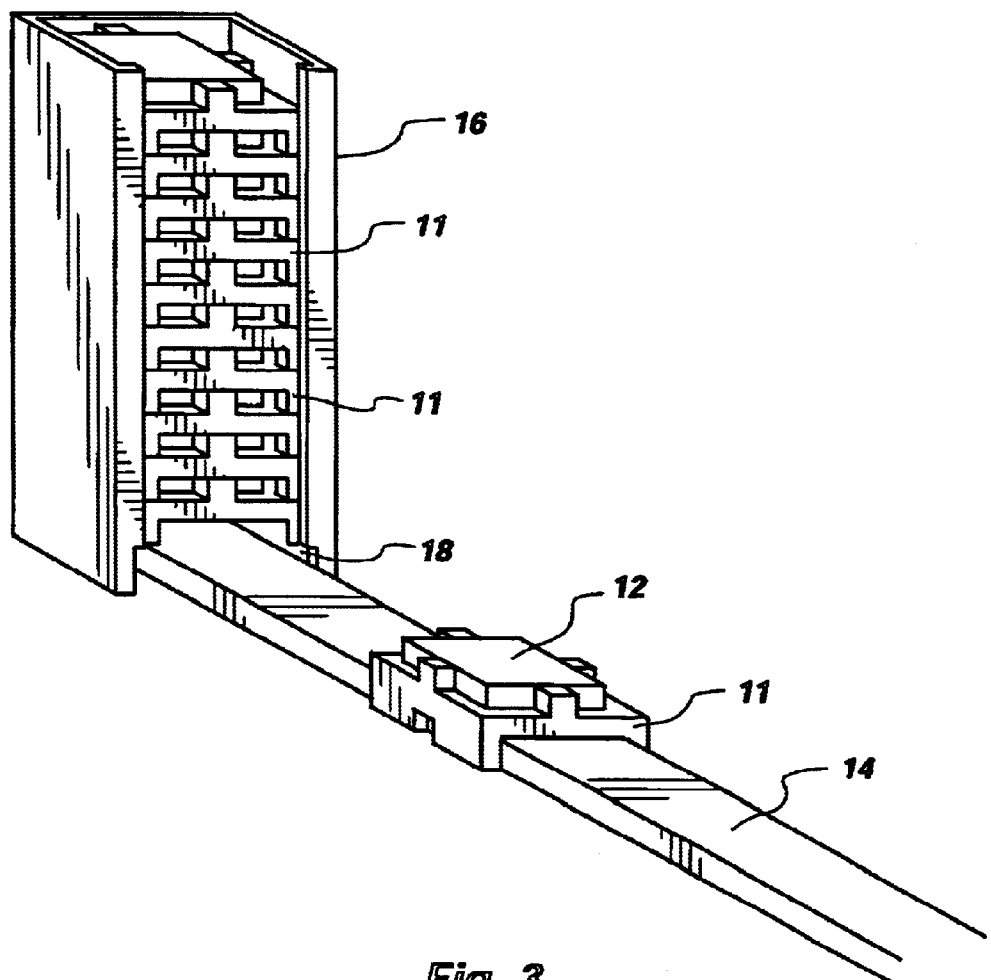
FIG. 3 is a close-up perspective view of a magazine and semiconductor chips contained therein in accordance with the invention shown in FIG. 1.

Referring to drawing FIG. 1, a laser marking apparatus 10 in accordance with the present invention is illustrated. Generally, the semiconductor chips (the term "chips" as used herein refers to a bare die or dice) 12 are automatically fed through the laser marking apparatus 10 for marking purposes. The chips 12 may be fed by a belt, chain, or pneumatic conveyor system as known in the art, gravity fed as shown in drawing FIG. 1, or delivered by other means known in the art. The chips 12 are first stacked in a feed magazine 16 (FIG. 3). When released from magazine 16 by a mechanical release mechanism as known in the art, the chips 12 exit through an opening 18 located proximate the bottom 20 of the feed magazine 16 onto the low-friction track 14.

Figure 2:
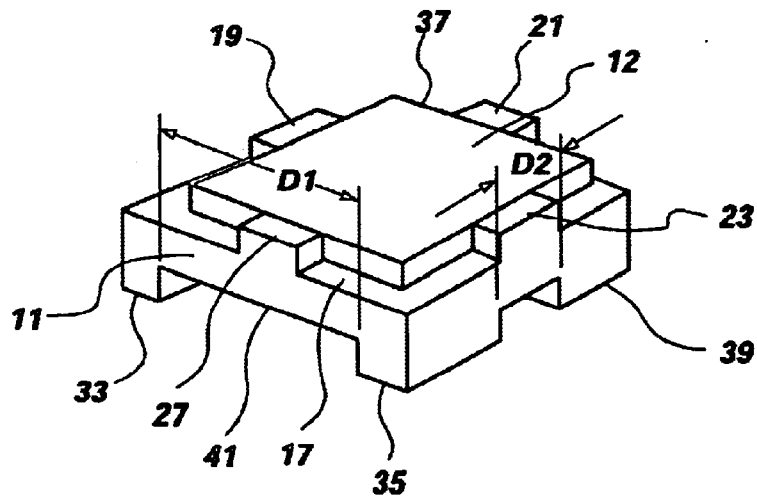
FIG. 2 is a perspective view of a semiconductor chip contained in a first embodiment of a chip carrier in accordance with the invention shown in FIG. 1.

As shown in drawing FIG. 2, the chips 12 are secured in carriers 11, preferably made of a statically dissipative material, such as certain plastics and other materials known in the art. The chip carriers 11 may be used to handle the chips 12 during many phases of the manufacturing process, up to and including shipment. The chips 12 are placed on a base 17 and held in place by projections 19, 21, 23, and 27. Legs 33, 35, 37 and 39 extend downwardly from the bottom 41 of the base 17. The legs 33 and 35 as well as legs 37 and 39 are separated by a distance D1 sufficient to allow passage of the track 14. Moreover, legs 35 and 39 as well as legs 33 and 37 are separated by a distance D2 to allow projections 23 and 19 to fit respectively therein whenever the chips 12 are stacked in their respective carriers 11.

As seen in drawing FIG. 3, the chips 12 are stacked in the feed magazine 16. The chips 12, suspended above the track 14 by the magazine 16, are individually released onto the track 14 and allowed to slide by the force of gravity down the track 14. The feed magazine 16 automatically releases the chips 12 at constant or selectively variable intervals dictated by process requirements. The feed magazine 16 may vary in size to accommodate large or small numbers of chips 12 and each carrier 11 may vary in size to accommodate one or more dice.

Figure 4:
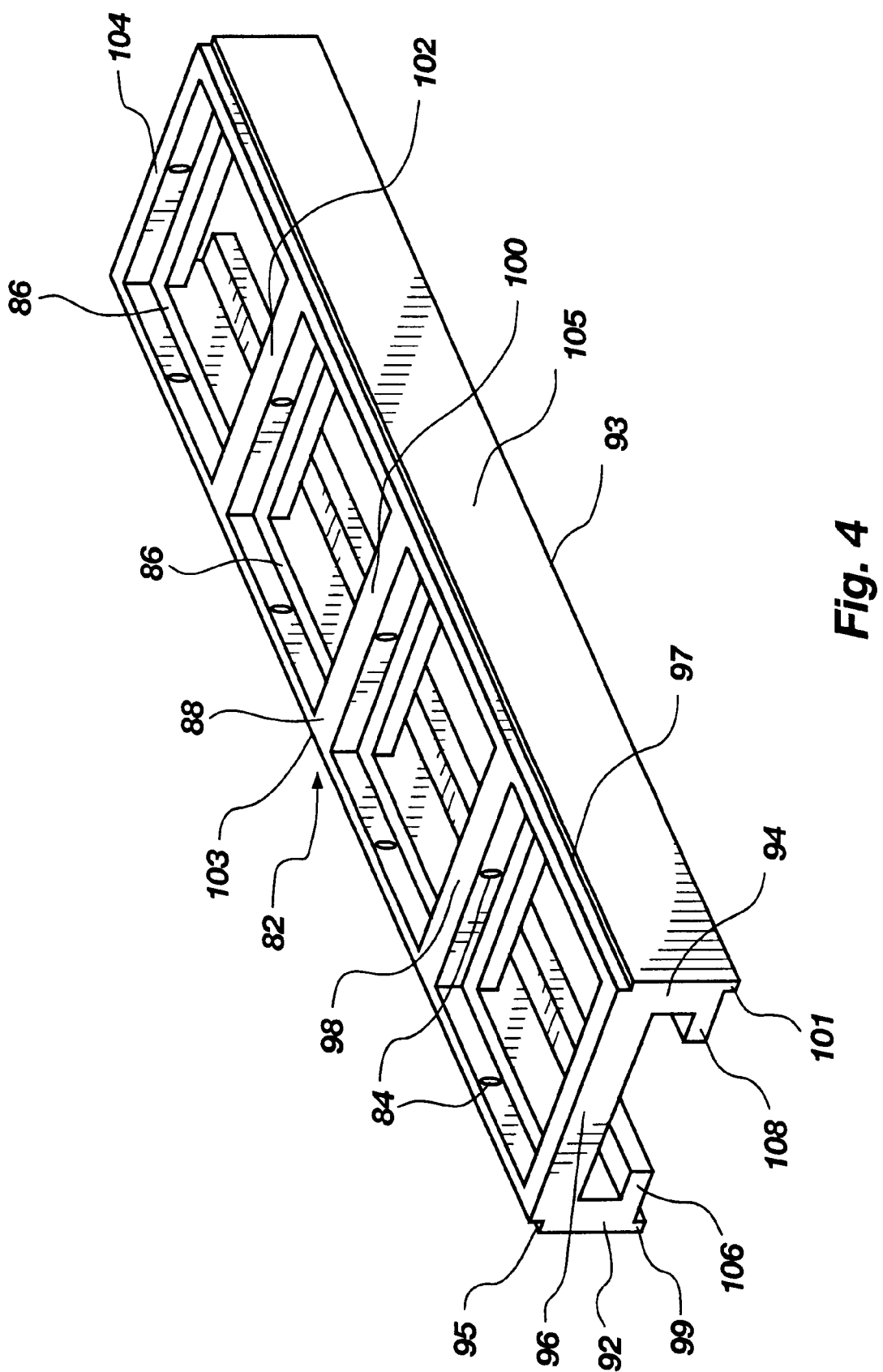
FIG. 4 is a perspective view of a second embodiment of a semiconductor chip carrier in accordance with the present invention.

Carriers 11 may also be in elongated form to accommodate a plurality of chips 12 to be marked. As depicted in drawing FIG. 4, an empty chip carrier 82 is capable of holding at least four (4) chips 12. The chip carrier 82 may also be modified to hold several dice that have not been cut apart (if increased in size) or an entire wafer (if modified to hold round rather than rectangular objects). Chips 12 are held in the carrier 82 by elements 84 which provide an interference or resiliently-biased fit as desired between the carrier 82 and a chip 12. Moreover, the chips 12 rest upon the lip 86 so that each chip 12 held by the carrier 82 extends equally above the top surface 88 of the carrier 82.

Figure 5:
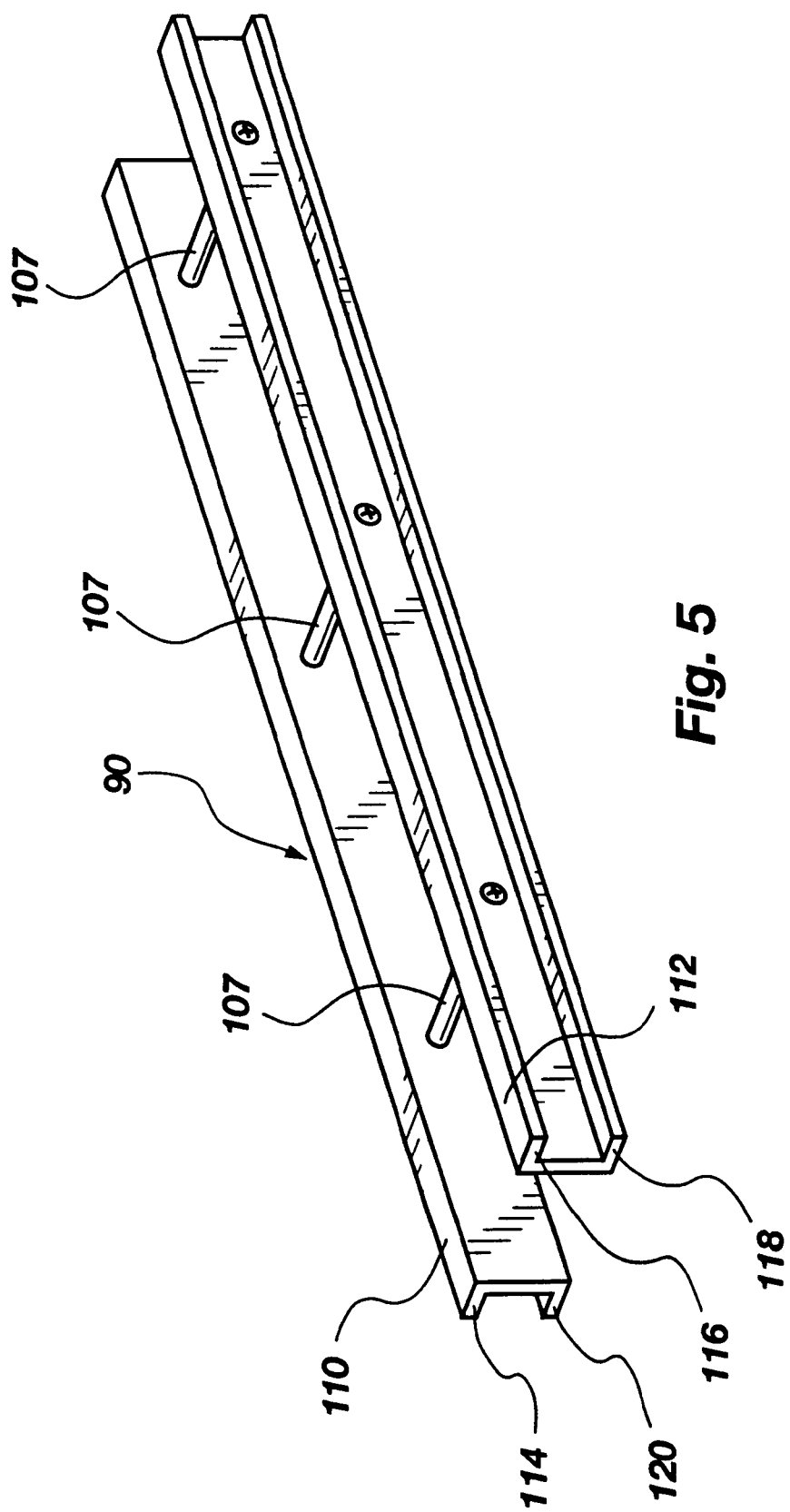
FIG. 5 is a perspective view of a portion of track in accordance with the semiconductor chip carrier shown in FIG. 4.

The carrier 82 is adapted to slide along a track positioned in several different orientations, such as a track 90 shown in drawing FIG. 5. The carrier 82 has legs 92 and 94 depending from and separated by cross-members 96, 98, 100, 102 and 104 extending the length of the carrier 82. The legs 92 and 94 are parallel to each other and have lateral extensions 106 and 108, respectively, spaced from the cross-members 96, 98, 100, 102 and 104 running the length of the legs 92 and 94 and projecting inwardly for grasping the elongate rails 110 and 112 of the track 90.

The rails 110 and 112 of the track 90 are shown oriented back-to-back and having a "C" shaped cross-section and are spaced apart by members 107. When the carrier 82 is riding on the top of the track 90, the lateral extensions 106 and 108 grasp the top portions 114 and 116 of the rails 110 and 112, respectively. If the carrier 82 is suspended from the bottom of the track 90 (in an inverted orientation), the lateral extensions 106 and 108 grasp the bottom portions 118 and 120, respectively. Moreover, because the carrier 82 is designed to actually grasp the track 90 rather than merely ride on it, the track may be placed in any orientation.

When the chips 12 are placed in the carrier 82 and the carrier 82 is positioned on the track 90, the marking operation may occur on either side. That is, because both sides of the chip 12 are exposed, neither the top nor the bottom of the chip 12 has any substantial portion covered by the carrier 82. If the chips 12 in the carrier 82 are automatically inspected, defective chips 12 may be automatically popped out of the carrier 82. A de-marking laser may be used to remove the defective mark and the chip 12 may then be reloaded into a carrier 82 and remarked. Thus, the requirements of the process and of the marking and inspection apparatus can dictate the orientation of the track 90, the carriers 82 thereon, and the chips 12 in the carriers 82.

The carrier 82 is also suited for stacking with other similar carriers. Extending longitudinally along the length of the top surface 88 of the outside edges 103 and 105 of the carrier 82 are channels 95 and 97 sized and shaped to receive extensions 99 and 101 extending downwardly from legs 92 and 94, respectively. The elongate extensions 99 and 101 also extend longitudinally the length of the carrier 82 along the bottom 93 of the carrier 82. The extensions 99 and 101 extend downwardly from the lateral extensions 106 and 108, respectively, a sufficient distance so that when stacked, the lateral extensions 106 and 108 are spaced above the chips 12 contained in the carrier 82.

Referring to drawing FIG. 1, illustrated is a laser marking apparatus 10 of the present invention in a gravity feed arrangement where the track 14 is placed at an angle A relative to the horizon such that the force of static friction between the carriers 11 and the track 14 is less than the force of gravity along the line of the track 14 on the carriers 11. When the chips 12 are released from the feed magazine 16, several chips 12 are staged, six (6) in this case, by automated indexing pins 22 and 24 at the initial staging area 13. Once the chips 12 are staged, indexing pin 24 is retracted to allow the staged chips 12 to slide on the track 14 until stopped by indexing pin 26 at the marking area 25. The chips 12 are held in place by indexing pin 26 until all of the chips 12 retained by indexing pin 26 are marked by the laser 28.

The laser 28 may be comprised of a carbon dioxide, Nd:YAG, or Nd:YLF laser or other suitable lasers known in the art so long as the laser energy, i.e., the radiant photon energy, is not or cannot substantially be transmitted through the substrate of the chip 12 to cause any harm to any portion of the chip 12 or any part of the circuitry or components thereof. That is, the substrate of the chip 12 is opaque to the radiant photon energy of the laser 28 to prevent heating or damage to the circuitry, components, or materials thereof or the substrate or the chip 12 cannot be substantially transmissible to the radiant photon energy of the laser beam for the heating of the chip 12 or damage to the circuitry or components of the chip 12 during the marking of the chip 12 by the laser 28. The laser 28 must produce radiant photon energy having a frequency which is not transmissible through the substrate of the chip 12. If the laser 28 produces a radiant photon energy beam having a frequency which is transmissible through the substrate of the chip 12, either another laser 28 must be used which has a frequency which is not transmissible through the substrate of the chip 12 or a doubler may be added to the laser 28 in an attempt to create a radiant photon energy having a frequency which is not transmissible through the substrate of the chip 12. Typically, a doubler added to the laser 28 that doubles the frequency of the radiant photon energy of the laser 28 will cause the radiant photon energy of the laser 28 to not be transmissible through the substrate of the chip 12 to cause harm to the circuitry, components, or materials thereof. For instance, if a $CO_2$ type laser is used for the marking of the chip 12, a doubler, known in the art, may be added thereto to increase the frequency of the radiant photon energy of the laser 28 to not be transmissible through the substrate of the chip 12, thereby causing no harm to the circuitry, components, or materials thereof. Radiant photon energy that is transmissible through the substrate of the chip 12 harms the circuitry thereof by localized heating, harms the components of the chip 12 by localized heating, and harms the materials of the components of the chip 12 by changing the electrical and physical characteristics of the material so that the material no longer functions as intended, either immediately or after a period of time from being exposed to the radiant photon energy.

The laser 28 is longitudinally translatable along the support 30 in at least one direction so that all of the chips 12 retained by indexing pin 26 can be marked by the laser 28 in a single pass.

Once the laser 28 marks the chips 12, indexing pin 26 is retracted and the chips 12 are allowed to slide until retained by indexing pin 32 at the debris removal and inspection area 31. As the chips 12 pass from indexing pin 26 to indexing pin 32, they slide under the debris removal system 34. The debris removal system 34 may employ suction, forced air and/or other methods known in the art to clean the surface 54 (FIGS. 7 and 9) of the chip 12 without disturbing the markings thereon (not shown).

The chip 12 adjacent the indexing pin 32 is then inspected by the camera 36 which may be a CCD camera or other suitable camera known in the art. That is, the camera 36 photographs the image of the surface 54 of the chip 12 and the markings contained thereon and sends this image to a central processing unit, such as CPU 80 in drawing FIG. 1. The image received by the CPU 80 is broken down into individual pixels and the pixels are compared to a minimum standard. Once the image is received and compared by the CPU 80, each chip 12 is released by the indexing pin 32. The adjacent, upstream chips 12 are maintained in position by the indexing pin 38 until each is released for inspection. If the chip 12 released by the indexing pin 32 is acceptable according to the comparison made by the CPU 80, then the chip 12 is allowed to slide on the track 14 to the final staging area 40. If the chip 12 is determined by the CPU 80 to be unacceptable, a trap door 42 is opened and the chip 12 falls into a bin 44 so that the chip 12 may be reworked and remarked.

An electronic eye 46 is positioned to identify when a proper number, in this case six (6), of acceptable chips 12 are ready to be packaged. Once the proper number of chips 12 is achieved, the indexing pin 48 is activated until all of the chips 12 held in the final staging area 40 have been loaded into a shipping magazine 50.

The apparatus 10 disclosed herein only requires an operator to load the feed magazine 16 with chips 12 to be marked and to remove and replace the shipping magazine 50 when full. The rest of the marking/inspection operation is completely automated and controlled by the CPU 80. Moreover, it is possible for the CPU 80 to control multiple track arrangements simultaneously.

Figure 6:
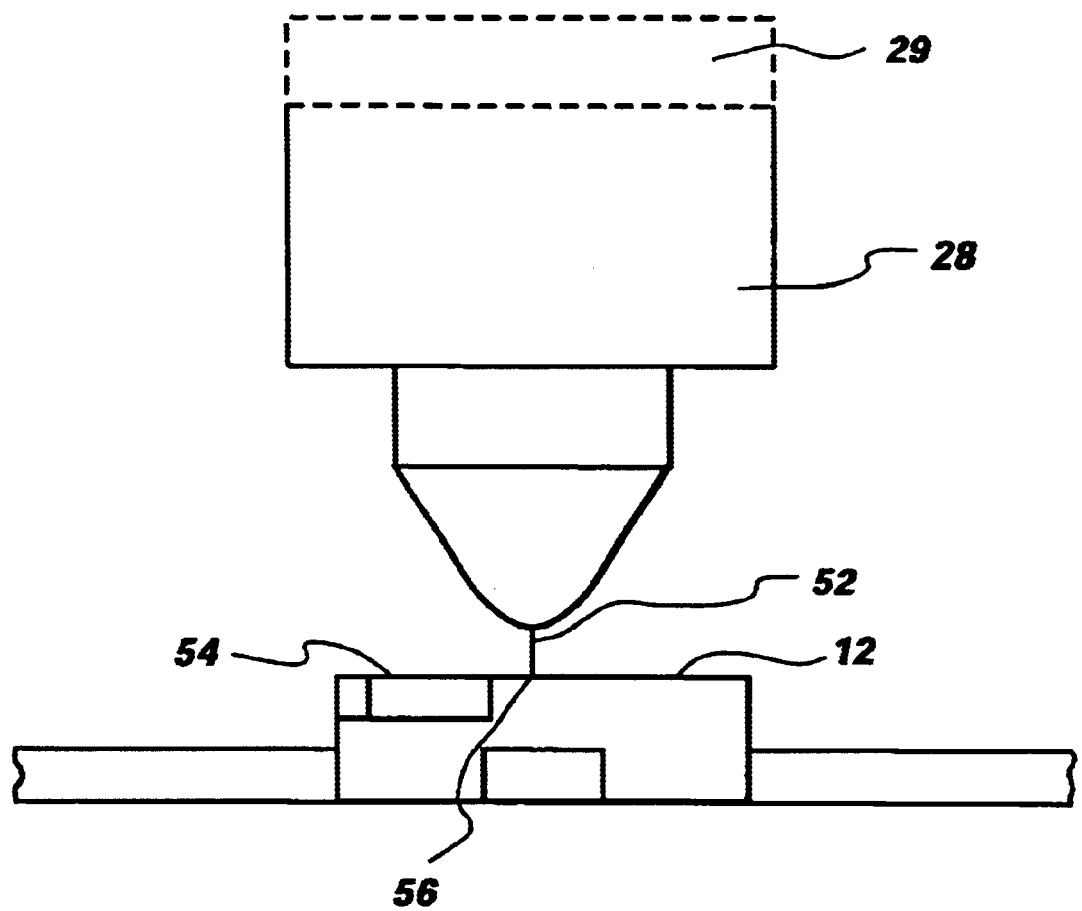
FIG. 6 is a close-up schematic side view of a first embodiment of a laser marking apparatus in accordance with the present invention.
Figure 7:
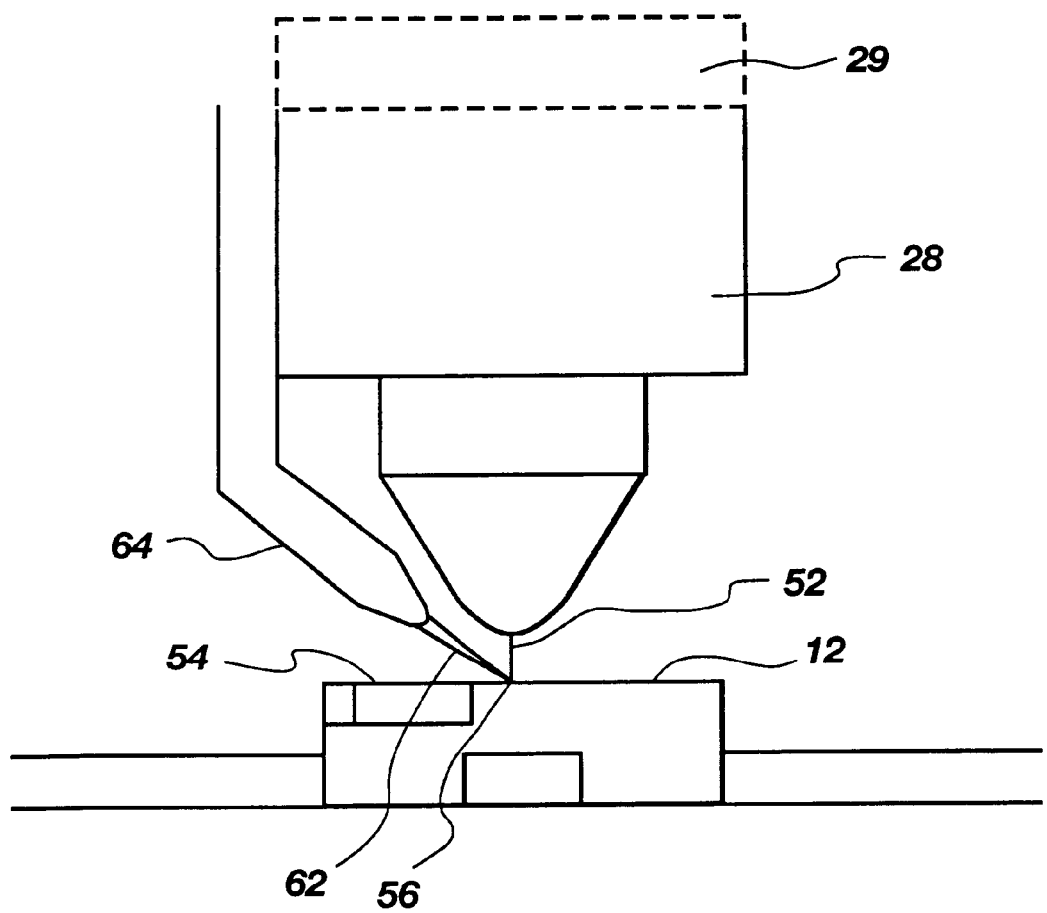
FIG. 7 is a close-up schematic side view of a second embodiment of a laser marking apparatus in accordance with the present invention.

Referring now to drawing FIGS. 6 and 7, a close-up view of the laser 28 in relation to the chip 12 is shown. The laser 28 projects a movable laser beam 52 onto the surface 54 of the chip 12 to mark the chip 12.

A coolant 62 may also be injected from a coolant injector or nozzle 64 onto the surface 54 of the chip 12 and onto the marking material 56 present on the chip surface 54. If a coolant 62 is used, any residual heat contained in the chip 12 or the marking material 56 may be quickly dissipated. This may be necessary to help protect the delicate circuitry, components, or materials of a bare semiconductor chip (die) 12 from the heat generated by the radiant photon energy of the laser beam 52 when it strikes portions of the circuitry, components, or materials of the semiconductor chip 12. The laser 28 is shown with or without the coolant nozzle 64 in drawing FIG. 1 or 8, respectively.

As can be seen, the coolant nozzle 64 is attached to the laser 28 so that any movement of the laser results in movement of the nozzle 64. Thus, the laser 28 and the nozzle 64 translate together, and are thus synchronous, so that a minimum amount of coolant 62 is required. Moreover, the marking location immediately surrounding the target surface on each chip 12 for laser beam 52 may be placed in a reduced or negative pressure environment with respect to the surrounding work area by means known in the art to reduce coolant drifting into the environment or onto other parts of the apparatus 10.

Figure 8:
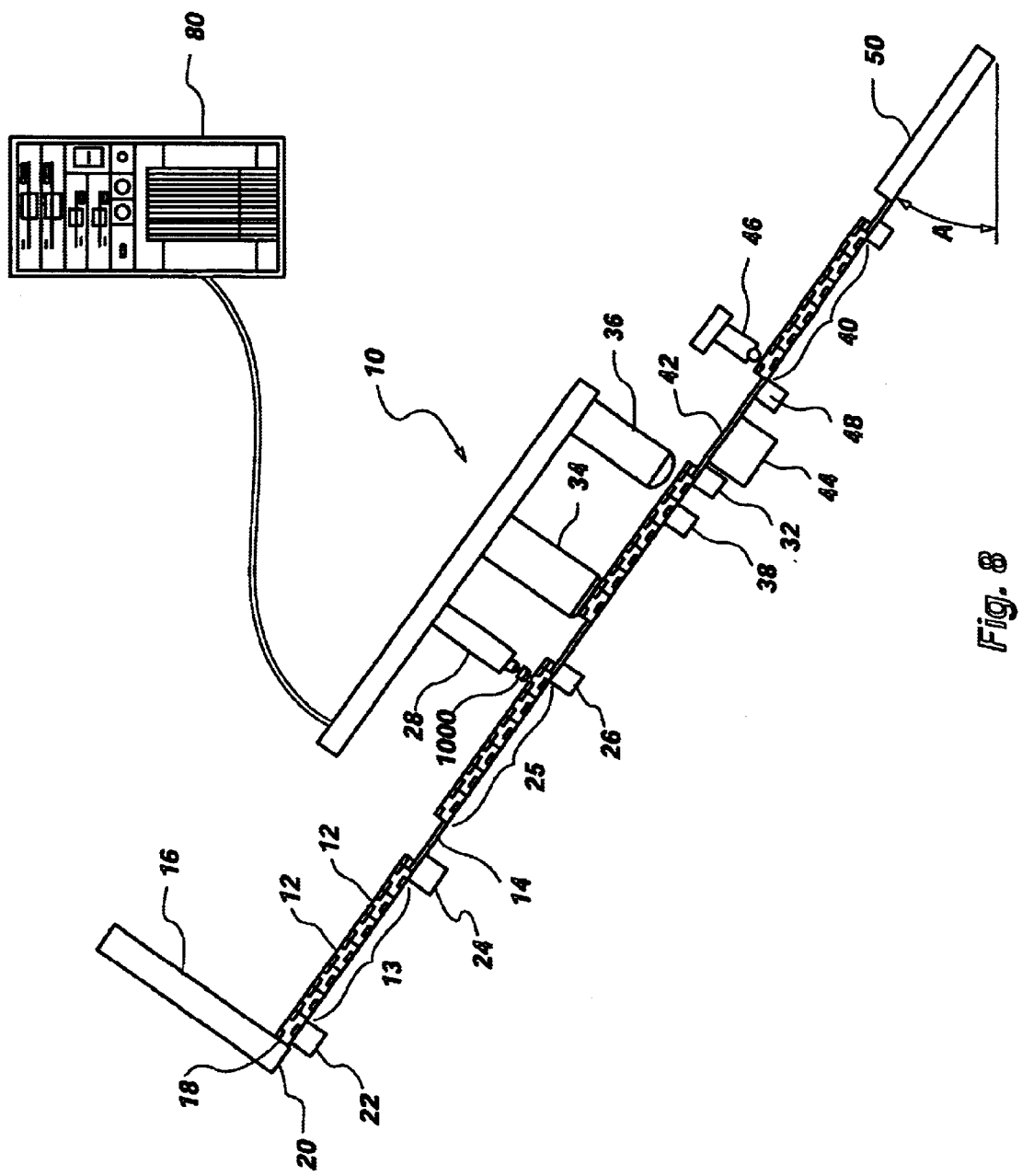
FIG. 8 is a schematic side view of a laser marking apparatus in accordance with a third embodiment of the present invention.

Referring to drawing FIG. 8, a third embodiment of the laser marking apparatus 10 in accordance with the present invention is illustrated. As previously described, the semiconductor chips (the term "chips" as used herein refers to bare die or dice) 12 are automatically fed through the laser marking apparatus 10 for marking purposes. The chips 12 may be fed by a belt, chain, or pneumatic conveyor system as known in the art, gravity fed as shown in drawing FIG. 8, or delivered by other means known in the art. The chips 12 are first stacked in a feed magazine 16. When released from magazine 16 by a mechanical release mechanism as known in the art, the chips 12 exit through an opening 18 located proximate the bottom 20 of the feed magazine 16 onto the low-friction track 14. In the third embodiment of the present invention of the laser marking apparatus 10, the apparatus 10 includes flat lens assembly 1000 having a prism or mirror, as known in the art, to direct the laser beam through the lens of the assembly and to each track, in turn, via the use of high speed galvanometers moving the assembly 1000 to thereby move the laser beam to form the desired markings (numbers, letters, symbols, logos, etc.) on the surface of the substrate of the chip 12. In this manner, the laser 28 may remain stationary while the laser beam is directed through the use of prisms or mirrors through the flat lens of the assembly 1000 to mark the chip 12.

Figure 9:
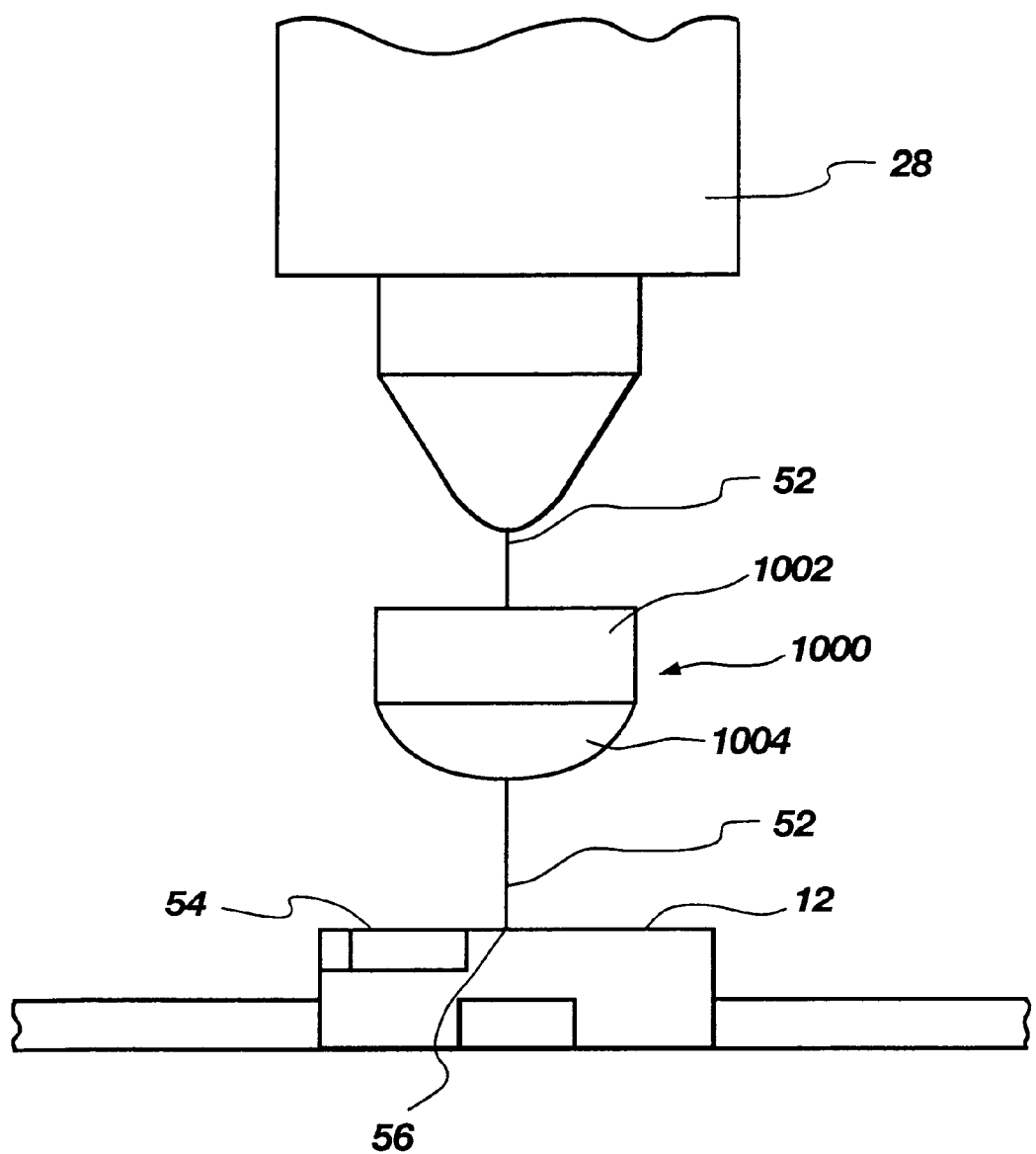
FIG. 9 is a close-up schematic side view of the third embodiment of a laser marking apparatus in accordance with the present invention.

Referring to drawing FIG. 9, a close-up view of the laser 28 in relation to the chip 12 and flat lens assembly 1000 is shown. The laser 28 projects a laser beam 52 onto portion 1002 of the assembly 1000 which portion includes one or more suitable well-known prisms or mirrors connected to suitable high speed galvanometers to drive the portion 1002 with respect to the flat lens 1004 to direct the laser beam 52 through the flat lens 1004 to form the desired markings on the substrate of the chip 12 or chips 12. Alternately, an oval headed laser system 28 may be used wherein the laser beam is split into two sets of galvanometers connected to one or more prisms or mirrors located in the portion 1002 of assembly 1000 to direct the laser beam 52 through the lens 1004 to form the desired markings on the substrate of the chip 12 or two chips 12 at the same time. However, such a system is more expensive.

The laser 28 should be chosen to have a radiant photon energy beam 52 that is not substantially transmissible through the substrate material (i.e., the substrate material is opaque to the beam 52) of the semiconductor chip 12 so that the radiant photon energy of the beam 52 does not potentially cause damage to either the circuitry or components of the semiconductor chip 12 or cause damage, change, alter, or affect the properties of the materials forming any electrical components, such as transistors or capacitors, of the semiconductor chip 12. The laser 28 may be selected to have a laser beam 52 having the desired frequency for the radiant photon energy which is not substantially transmissible through the substrate of the semiconductor chip 12 or an existing laser 28 may have the frequency of the radiant photon energy forming the laser beam 52 altered by using a frequency doubler 29 associated with the laser 28, known in the art, to cause a change in the frequency of the radiant photon energy forming the laser beam 52 so that the beam 52 is not substantially transmissible through the substrate of the semiconductor chip 12. The radiant photon energy of the laser beam 52 of laser 28 should not be transmissible through a typical substrate, such as silicon, of the semiconductor chip 12 or any other type substrate material of the semiconductor chip 12. That is, the substrate should be opaque to the radiant photon energy of the laser beam 52. The less opaque or more transmissible the substrate of the chip 12 is regarding the radiant photon energy forming the laser beam 52, the greater the likelihood of damage to the circuitry or components of the chip 12 or damage or change in the electrical and physical properties of the materials used in the circuitry and components of the chip 12. Therefore, care and caution must be taken in determining the degree to which the substrate of the chip 12 is opaque or does not allow transmission of the radiant photon energy of the laser 28 therethrough for marking purposes. An acceptable laser 28 having a radiant photon energy at one power lever for use in the marking of a chip 12 may be unacceptable for use at another higher power level of radiant photon energy therefrom as the substrate of the chip 12 may allow the transmission of too much of the radiant photon energy therethrough, thereby causing damage or change to the circuitry, components, and materials of the chip 12. Substrates of the chip 12 which allow transmission therethrough of small amounts of the radiant photon energy from the laser 28 or are not opaque to the radiant photon energy of the laser 28 may allow damage to the circuitry, components, or materials of the chip 12 or changes thereto at differing power levels, which damage or changes may not be readily apparent at the time of the laser 28 marking the chip 12 and will, subsequently, be apparent during testing or use of the chip 12 after the marking thereof. As set forth herein, the terminology directed to the substrate being substantially opaque to the radiant photon energy means that the substrate is sufficiently opaque to the radiant photon energy of the laser 28 for inconsequential, little, or no discernable damage to occur to the circuitry, components, or materials of the chip 12 during the marking process at the level of power for the radiant photon energy produced by the laser 28 to affect the same either immediately after the marking process or during testing or use of the chip 12.

While the present invention has been described in terms of certain preferred embodiments, it is not so limited, and those of ordinary skill in the art will readily recognize and appreciate that many additions, deletions and modifications to the embodiments described herein may be made without departing from the scope of the invention as hereinafter claimed. As used in the claims, as in the preceding specification, the term "chip" or "chips" is intended to mean and encompass bare semiconductor dice including both the circuit side and/or back (Si) side thereof.

Additionally, while the invention has been described in conjunction with the use of a laser as an energy source for the marking of a chip or chips any suitable energy source having a focused radiant photon energy source may be used so long as the suitable energy source is not transmissible through the substrate of the semiconductor chip.

While changes, additions, modifications, and deletions may be made to the present invention which are within the skill of those in the art, all such are to be considered within the scope of the claimed invention.

What is claimed is:

1. A semiconductor chip marking method comprising:

providing an energy beam having a predetermined frequency;

providing a substrate including circuitry on at least one surface thereof, said substrate substantially opaque to said predetermined frequency of said energy beam;

directing said energy beam onto another surface of said substrate;

forming a mark on said another surface of said substrate; and placing a chip in a path of said energy beam.

2. The method of claim 1, further comprising:

translating said energy beam to mark said chip.

3. The method of claim 1, further comprising:
fixing a source of said energy beam; and
translating said energy beam to mark said chip.

4. The method of claim 1, further comprising:
translating a source of said energy beam.

5. The method of claim 1, further comprising:
inspecting the quality of said mark.

6. The method of claim 3, further comprising:
rejecting said chip if said mark is not within selected quality control parameters.

7. The method of claim 1, further comprising:
injecting a coolant onto a surface of said substrate either during or immediately subsequent to said forming said mark.

8. The method of claim 1, wherein:
said energy beam includes a laser beam.

9. The method of claim 1, wherein said energy beam includes a focused light source.

10. The method of claim 1, wherein:
said energy beam includes a radiant photon energy beam.

11. A semiconductor chip marking method comprising:
providing a radiant photon energy beam having a predetermined frequency;
providing a substrate having circuitry on at least one surface thereof, said substrate substantially opaque to said predetermined frequency of said radiant photon energy beam;
directing said radiant photon energy beam onto another surface of said substrate;
forming a mark on said another surface of said substrate; and
placing a chip in a path of said radiant photon energy beam.

12. The method of claim 11, further comprising:
translating said radiant photon energy beam to mark said chip.

13. The method of claim 11, further comprising:
fixing a source of said radiant photon energy beam; and
translating said radiant photon energy beam to mark said chip.

14. The method of claim 11, further comprising:
translating a source of said radiant photon energy beam.

15. The method of claim 11, further comprising:
inspecting the quality of said mark.

16. The method of claim 15, further comprising:
rejecting said chip if said mark is not within selected quality control parameters.

17. The method of claim 11, further comprising:
injecting a coolant onto a surface of said substrate either during or immediately subsequent to said forming said mark.

18. The method of claim 11, wherein:
said radiant photon energy beam includes a laser beam.

19. The method of claim 11, wherein said radiant photon energy beam includes a focused light source.

20. A semiconductor chip marking method comprising:
providing a substrate formed of a material;
providing an energy beam having a predetermined frequency substantially nontransmissible through said material of said substrate;
directing said energy beam onto a surface of said substrate; and
forming a mark on said surface of said substrate.

21. The method of claim 20, further comprising:
placing a chip in a path of said energy beam.

22. The method of claim 21, further comprising:
translating said energy beam to mark said chip.

23. The method of claim 21, further comprising:
fixing a source of said energy beam; and
translating said energy beam to mark said chip.

24. The method of claim 20, further comprising:
translating a source of said energy beam.

25. The method of claim 21, further comprising:
inspecting the quality of said mark.

26. The method of claim 25, further comprising:
rejecting said chip if said mark is not within selected quality control parameters.

27. The method of claim 21, further comprising:
injecting a coolant onto said surface of said substrate either during or immediately subsequent to said forming said mark.

28. The method of claim 20, wherein said energy beam includes a laser beam.

29. The method of claim 20, wherein:
said energy beam includes a focused light source.

30. The method of claim 20, wherein:
said energy beam includes a radiant photon energy beam.

31. A semiconductor chip marking method comprising:
providing a radiant photon energy beam having a predetermined frequency;
providing a substrate of a material substantially opaque to said predetermined frequency of said radiant photon energy beam;
directing the radiant photon energy beam onto a surface of said substrate; and
forming a mark on said surface of said substrate.

32. The method of claim 31, further comprising:
placing a chip in a path of said radiant photon energy beam.

33. The method of claim 32, further comprising:
translating said radiant photon energy beam to mark said chip.

34. The method of claim 31, further comprising:
fixing a source of said radiant photon energy beam; and
translating said radiant photon energy beam to mark said chip.

35. The method of claim 31, further comprising:
translating a source of said radiant photon energy beam.

36. The method of claim 32, further comprising:
inspecting the quality of said mark.

37. The method of claim 36, further comprising:
rejecting said chip if said mark is not within selected quality control parameters.

38. The method of claim 32, further comprising:
injecting a coolant onto said surface of said substrate either during or immediately subsequent to said forming said mark.

39. The method of claim 31, wherein:
said radiant photon energy beam includes a laser beam.

40. The method of claim 31, wherein:
said radiant photon energy beam includes a focused light source.

41. A semiconductor chip marking method comprising:
providing an energy beam;
configuring said energy beam to have a predetermined frequency;

providing a substrate comprised of a material substantially opaque to said predetermined frequency of said energy beam, said substrate having circuitry;

channeling said energy beam onto a surface of said substrate;

forming a mark on said surface of said substrate; and preventing substantial damage to said circuitry of said substrate by said energy beam by said material of said substrate being substantially opaque to said predetermined frequency of said energy beam.

42. The method of claim 41, further comprising:

placing a chip in a path of said energy beam.

43. The method of claim 42, further comprising:

translating said energy beam to mark said chip.

44. The method of claim 41, further comprising:

translating a source of said energy beam to mark said chip.

45. The method of claim 41, further comprising:

fixing a source of said energy beam; and translating said energy beam to mark said chip.

46. The method of claim 45, further comprising:

inspecting the quality of said mark.

47. The method of claim 46, further comprising:

rejecting said chip if said mark is not within selected quality control parameters.

48. The method of claim 42, further comprising:

injecting a coolant onto said surface of said substrate either during or immediately subsequent to said forming said mark.

49. The method of claim 41, wherein:

said energy beam includes a laser beam.

50. The method of claim 4, wherein:

said energy beam includes a focused light source.

51. The method of claim 41, wherein:

said energy beam includes a radiant photon energy beam.

52. A semiconductor chip marking method comprising:

providing radiant photon energy beam;

configuring said radiant photon energy beam to have a predetermined frequency;

providing a substrate comprising a material through which said predetermined frequency of said radiant photon energy beam is substantially not transmissible, said substrate having circuitry;

channeling said radiant photon energy beam onto a surface of said substrate;

forming a mark on said surface of said substrate; and preventing substantial damage to said circuitry of said substrate by said radiant photon energy beam from said substrate not substantially transmitting said predetermined frequency of said radiant photon energy beam therethrough.

53. The method of claim 52, further comprising:

placing a chip in a path of said radiant photon energy beam.

54. The method of claim 53, further comprising:

translating said radiant photon energy beam to mark said chip.

55. The method of claim 52, further comprising:

translating a source of said radiant photon energy beam to mark said chip.

56. The method of claim 52, further comprising:

fixing a source of said radiant photon energy beam; and translating said radiant photon energy beam to mark said chip.

57. The method of claim 52, further comprising:

inspecting the quality of said mark.

58. The method of claim 57, further comprising:

rejecting said chip if said mark is not within selected quality control parameters.

59. The method of claim 52, further comprising:

injecting a coolant onto said surface of said substrate either during or immediately subsequent to said forming said mark.

60. The method of claim 52, wherein:

said radiant photon energy beam includes a laser beam.

61. The method of claim 52, wherein:

said radiant photon energy beam includes a focused light source.

\* \* \* \* \*